United States Patent [19]

Caplan

[11] Patent Number: 4,568,409

[45] Date of Patent: Feb. 4, 1986

[54] PRECISION MARKING OF LAYERS

[75] Inventor: Sandor Caplan, Lawrenceville, N.J.

[73] Assignee: Chronar Corp., Princeton, N.J.

[21] Appl. No.: 552,737

[22] Filed: Nov. 17, 1983

[51] Int. Cl.⁴ .......................... C23F 1/02; B44C 1/22; C03C 15/00; C03C 25/06

[52] U.S. Cl. ...................................... 156/643; 29/572; 156/656; 156/659.1; 156/904; 219/121 LH; 219/121 LM; 427/53.1; 430/363

[58] Field of Search ................. 219/121 LG, 121 LH, 219/121 LJ, 121 LP, 121 LM; 29/572; 430/313, 318, 321, 363; 427/53.1, 74; 357/30, 31, 29; 136/244, 252, 258, 261; 156/643, 655, 656, 659.1, 904, 667, 668

[56] References Cited

U.S. PATENT DOCUMENTS

| 4,037,075 | 7/1977 | Pugsley et al. ............. 219/121 LM |
| 4,259,433 | 3/1981 | Mizobuchi et al. ............ 427/53.1 X |
| 4,315,096 | 2/1982 | Tyan et al. .......................... 29/572 X |

Primary Examiner—William A. Powell
Attorney, Agent, or Firm—George E. Kersey

[57] ABSTRACT

Selective incision of metallic layers overlying semiconductors by laser ablation (evaporation) of selected regions of a dye sensitized coating on each such metallic layer, followed by etching of the metallic layer to avoid objectionable alloying by laser scribing of the metallic layer to provide the desired incisions.

15 Claims, 4 Drawing Figures

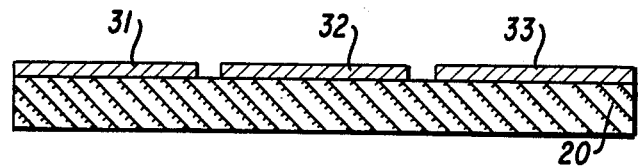
*FIG. 1A*
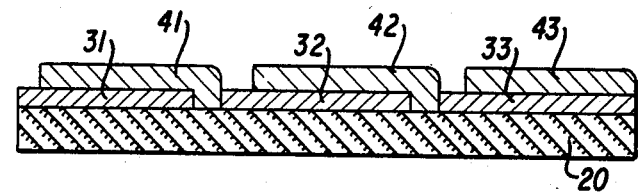
*FIG. 1B*
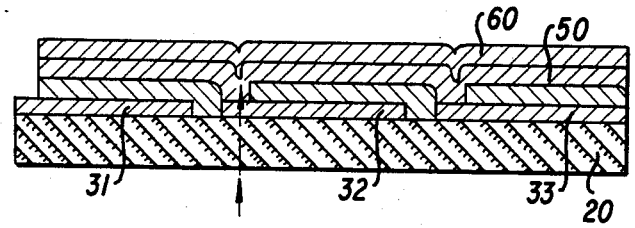
*FIG. 1C*
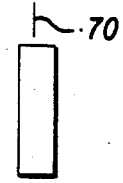
*FIG. 2*
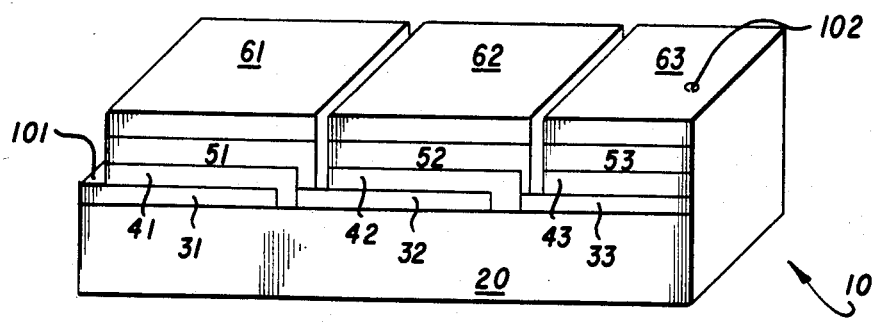

PRECISION MARKING OF LAYERS

BACKGROUND OF THE INVENTION

This invention relates to the marking or incising of layers, and, more particularly to the precision separation of layers in photovoltaic devices.

In the fabrication of many different kinds of devices it is often necessary to separate the underlying constituents. The separational process can be intricate and difficult in the case of miniaturized devices. In the case of photovoltaic devices such as solar cells there are a number of small scale layers which must be physically parted in order to realize a practical large scale device. In the specific case of amorphous silicon cells the overall structure is formed by three successive layers which must be separated from corresponding layers in adjoining cells. More specifically, a base layer of amorphous silicon overlies a transparent conductive layer, typically of tin oxide, and underlies an outer metallic layer, typically of aluminum.

In order to separate the amorphous silicon layers of adjoining cells, it is common practice to employ a laser beam which is moved along the region that is to be separated. Once the desired separation of the amorphous silicon layers takes place and the overlying layer of aluminum is applied, separation of the aluminum for the adjoining cells can also take place by moving the laser beam along the region intended to be parted.

However, in the case of the outer metallic layer the separation of the metallic portions of adjoining cells is difficult to achieve. This is because there is an alloying reaction that takes place between the semiconductor material such as silicon and most metals when exposed to a high intensity laser beam.

In conventional practice the problem of alloying was countered by the use of masking during the outlying metalization. Unfortunately masking has the effect of significantly reducing the utilization of the active layers of the devices because of the large areas that are required in order to achieve suitable masking. In addition there is invariably a further significant reduction in device area because of difficulties associated with mask misalignment.

In one attempt to overcome the difficulties associated with masking, a photoresist has been employed in which the laser is used to expose the photoresist which is then developed and used in a subsequent etching step. This procedure is objectionable because of the significant cost associated with photoresist chemicals, developers and removers. There is also an undesirable time delay associated with the required separate steps of exposure, development and removal of the photoresist material. There is the further objection that different lasers must be employed for the parting of the base amorphous silicon layer and the overlying conductive layer.

Accordingly, it is an object of the invention to facilitate the marking or incising of layers. A related object is to facilitate the marking or incising of layers employed in photovoltaic devices. Still another related object is to facilitate the marking or incising of the outer metalization layer commonly employed in photovoltaic devices.

Still another object of the invention is to achieve precision separation of layers in photovoltaic devices without requiring the use of different marking and incising apparatuses such as lasers for the various layers. A related object is to permit the marking or incising of layers in photovoltaic devices using common marking apparatus such as a laser for all of the layers in the device.

A further object of the invention is to achieve precision close spacing of adjoing layers in miniaturized devices, particularly in photovoltaic devices formed by an array of miniature solar cells. A related object is to avoid the significant gap between adjoining layers occasioned by the use of masking.

Yet another object of the invention is to avoid the need for photoresist and related procedures in the precision separation of layers in photovoltaic devices. A related object is to avoid the expense, delay and inconvenience associated with the use of photoresist, developers and removers.

SUMMARY OF THE INVENTION

In accomplishing the foregoing and related objects, the invention provides for the precision separation of layers by coating each such layer with a functional material that is absorptive of energy at a selected spectral frequency, and by applying spectral energy to the coating in order to selectively remove the material. Once the functional material is selectively removed, the underlying layer can be parted in any convenient way, for example by etching.

In accordance with one aspect of the invention, the layer that is parted is metallic and the functional material is a polymer that is resistant to the metal's etchant.

In accordance with another aspect of the invention, the layer that is to be parted is supported by a substrate and one or more layers of silicon can be interposed between the metallic layer and the substrate. The silicon layers are desirably of amorphous silicon.

In accordance with a further aspect of the invention, the spectral energy is applied to the polymer indirectly, for example through a substrate of glass. The spectral energy is desirably derived from a laser source.

In accordance with a still further aspect of the invention, the polymer is made absorptive of spectral energy, for example from a laser source, by the addition of a material which is absorptive of spectral energy. Such a material is a dye which is absorptive of energy corresponding to the color associated with the dye. The term "color" is used in the sense of describing the spectral characteristic that is uniquely associated with the dye so that for dyes responding outside the visible spectrum, the color is not humanly visible but is machine visible. The word "dye" is used in a similar sense.

In accordance with a particular aspect of the invention, the dye is absorptive in the visible range (for convenience). It also provides significant absorption at 1.06 microns. A suitable dye is nigrosine which when dissolved in a metal staining polymer that is ketone solvent soluble exhibits these desired properties.

DESCRIPTION OF THE DRAWINGS

Other aspects of the invention will become apparent after considering several illustrative embodiments taken in conjunction with the drawings in which:

FIG. 1A is a cross sectional view of a substrate coated with a conductive layer that has been separated by a laser to form the base elements of solar cells that are to be tandem connected;

FIG. 1B is a cross sectional view of FIG. 1A with overlying laser separated semiconductor layers;

FIG. 1C is a cross sectional view of FIG. 1B with an overlying metallic layer that is being parted in accordance with the invention; and FIG. 2 is a perspective view of a tandem connectable resulting structure in accordance with the invention.

DETAILED DESCRIPTION

With reference to the drawings, FIG. 1A shows a substrate 20, typically of glass that is coated with a conductive layer that has been separated into three illustrative parts 31, 32 and 33 to serve as the basis for three separate solar cells which are to be series connected. The elements 31, 32 and 33 are produced by applying a continuous layer 30 (not shown) of tin oxide to the substrate 20 and using a laser to part the material. This can be done by operating a neodymium yttrium-aluminum-garnet (YAG) laser at 1.06 micrometers in the plused or Q-switched mode with an average power of about 4.5 watts and a pluse rate of about 3 kiloHertz. The rate of separation can be achieved on the order of 13 centimeters per second.

After the conductive elements 31, 32 and 33 are formed as desdribed above, a layer 40 (not shown) is applied and parted in similar fashion to that described above to form individual amorphous silicon semiconductor elements 41, 42 and 43. The layer 40 from which the elements 41, 42 and 43 are derived is applied in a reaction chamber by, for example, heat assisted glow discharge decomposition of higher order silanes.

The final step in the formation of an overall device is illustrated in FIG. 1C where an overlying back electrode layer 50 of conductive material such as aluminum, titanium, chromium or the like is formed on the elements 41, 42 and 43. The layer 50 is produced by vapor deposition, sputtering or in other related ways, and is followed by the application of a layer 60 of functional material containing a suitable laser absorptive dye. The functional material 60 is energized by the illustrative laser beam 70 which is applied to the substrate along the desired parting line for the underlying metallic layer 50. The energized functional material is ablated by vaporization. This procedure is followed by etching the metallic layer. The functional layer is then dissolved away using a suitable solvent.

The result is the series-connected structure shown in FIG. 2 where the metallic layer 50 has been subdivided into individual conductive elements 51, 52 and 53 and the polymeric layer 60 has been subdivided into individual polymeric elements 61, 62 and 63. The groups of elements 31, 41, 51; 32, 42, 52; and 33, 43, 53 are series connected. The overall device 10 extends from conductive element 31 to outer conductive element 52 with a second cell of elements 32, 42 and 52 being connected to the first cell by the contact of the conductive element 51 with the element 32 and the further contact of the conductive element 52 with the final conductive element of the third cell 33.

External contacts 101 and 102 are affixed at the extremities 31 and 53 of the device 10 to complete the struc- ture.

The invention is further illustrated by the following non-limiting examples.

EXAMPLE I

A glass substrate measuring 1-foot by 1-foot and having a thickness of ⅛-inch is coated with transparent tin oxide to a thickness of 1,000 Angstroms. The tin oxide is parted with a Q-switched neodymium yttrium-aluminum-garnet laser at a power of 4.5 watts and a plus rate of 3 kiloHertz. The parting rate is on the order of about 13 centimeters per second, using a lens with a focal length of 150 millimeters. The result is a groove with a width approximately 0.1 millimeters between individual tin oxide elements.

After the conductive elements are formed an active semiconductor region is created by heat assisted glow discharge decomposition of higher order silanes to form three successive layers with different electrical properties. The first active layer has a thickness on the order of 100 Angstroms and is produced by introducing a p-type dopant into the higher order silanes in the reaction chamber. This is followed by an intrinsic layer having a thickness of about 6,000 Angstrom units and an overlying doped layer of about 500 Angstroms formed by the introduction of an n-type dopant into the silane vapors. The active semiconductor region is parted using the laser described above. Again the separation between adjoining active elements is on the order of 0.1 millimeters and the parting does not penetrate the underlying tin oxide layer.

The structure is then coated with aluminum having a thickness of about 0.2 microns and further coated with a metal staining polymer containing 1.1 percent by weight nigrosene dye. The metal staining polymer is obtainable from the Keystone Chemical Company and is sold under the designation "Dykem Staining DL". The laser described above is then used to part the polymeric layer thickness of 2 to 3 microns at a rate of about 13 centimeters per second.

The energy activitation is usually sufficient to ablate the polymer in the regions of desired parting.

The separation of the outer electrode is achieved using a standard metal etchant (chosen for the marticular metallization), resulting in a parting line of approximately 0.1 millimeters in width.

EXAMPLE II

Example I is repeated with nigrosene substituted by bis(4-dimethylamino dinitrobenzil) nickel.

The results are substantially the same as for Example I.

What is claimed is:

1. The method of precision separation of layers which comprises the steps of
    (a) coating the layer to be separated with a functional material that is absorptive at a selected spectral frequency and resistant to a chosen etch method, said layer being supported on a substrate with one or more layers of silicon interposed between said substrate and said layer;
    (b) applying spectral energy to the coated layer to selectively remove only the material; and
    (c) separating the underlying layer in the regions thereof where said coating material is removed.

2. The method of claim 1 wherein said silicon is amorphous.

3. The method of precision separation of layers which comprises the steps of
    (a) coating the layer to be separated with a functional material that is absorptive at a selected spectral frequency and resistant to a chosen etch method, said layer being supported on a substrate,
    (b) applying spectral energy to the coated layer to selectively remove only the material, said spectral energy being applied to said material through said substrate; and (c) separating the underlying layer in the regions thereof where said coating is removed.

4. The method of claim 3 wherein said spectral energy is laser applied.

5. The method of claim 3 wherein the underlying layer is separated by etching.

6. The method of precision separation of layers which comprises the steps of
   (a) coating the layer to be separated with a polymer containing a functional material that is absorptive to a selected spectral frequency and resistant to a chosen etch method;
   (b) applying spectral energy to the coated layer to selectively remove only the material which absorbs said spectral energy; and
   (c) separating the underlying layer in the regions thereof where said coating material is removed.

7. The method of claim 6 wherein the polymer is etch resistant.

8. The method of claim 6 wherein the absorptive material is a dye.

9. The method of claim 8 wherein said dye is absorptive of a laser generated frequency or a harmonic thereof.

10. The method of claim 9 wherein the laser absorptive frequency is beyond the visible spectral range.

11. The method of claim 10 wherein the absorption is at 1.06 microns.

12. The method of claim 8 wherein the dye is nigrosene.

13. The method of claim 12 wherein the nigrosene is dissolved in a metal staining polymer.

14. The method of claim 13 wherein the polymer is water soluble.

15. The method of claim 6 wherein the first mentioned layer is metallic.

* * * * *